(12) United States Patent
Morishita

(10) Patent No.: US 11,190,004 B2
(45) Date of Patent: Nov. 30, 2021

(54) RELAY FAILURE DIAGNOSIS CIRCUIT

(71) Applicant: DENSO WAVE INCORPORATED, Aichi-pref. (JP)

(72) Inventor: Takeru Morishita, Chita-gun (JP)

(73) Assignee: DENSO WAVE INCORPORATED, Aichi-Pref. (JP)

( * ) Notice: Subject to any disclaimer, the term of this patent is extended or adjusted under 35 U.S.C. 154(b) by 137 days.

(21) Appl. No.: 16/752,722

(22) Filed: Jan. 27, 2020

(65) Prior Publication Data
US 2020/0259321 A1    Aug. 13, 2020

(30) Foreign Application Priority Data

Feb. 13, 2019  (JP) .............................. JP2019-023377

(51) Int. Cl.
*G01R 31/327*  (2006.01)
*H02H 3/05*    (2006.01)
*H02H 1/00*    (2006.01)

(52) U.S. Cl.
CPC ........... *H02H 3/05* (2013.01); *G01R 31/3278* (2013.01); *H02H 1/0007* (2013.01)

(58) Field of Classification Search
CPC ..... G01R 31/3278; H02H 3/05; H02H 1/0007
See application file for complete search history.

(56) References Cited

U.S. PATENT DOCUMENTS

| 10,475,612 | B2* | 11/2019 | Zhang ................ G01R 31/3278 |
| 2011/0205672 | A1* | 8/2011 | Sakai .................. B62D 5/0487 |
| | | | 361/18 |
| 2012/0161681 | A1* | 6/2012 | Kuroda ............... B62D 5/0481 |
| | | | 318/400.21 |
| 2017/0207051 | A1* | 7/2017 | Tonet ..................... H01H 50/64 |
| 2018/0238935 | A1* | 8/2018 | Nakashima .......... G01R 19/003 |
| 2020/0096571 | A1* | 3/2020 | Hanai .................. H01H 47/004 |
| 2020/0321774 | A1* | 10/2020 | Chen ..................... H03K 17/60 |

FOREIGN PATENT DOCUMENTS

JP      2010-140803 A    6/2010

* cited by examiner

*Primary Examiner* — Scott Bauer
(74) *Attorney, Agent, or Firm* — Harness, Dickey & Pierce, P.L.C.

(57) ABSTRACT

The present disclosure describes a failure diagnosis circuit may comprise a first terminal, a second terminal, a first relay and a second relay, a diagnostic signal transmission circuit, a transmission circuit diagnosis circuit, a first diagnostic signal reception circuit, a first reception circuit diagnosis circuit, a second diagnostic signal reception circuit, a second reception circuit diagnosis circuit, and a controller.

10 Claims, 6 Drawing Sheets

US 11,190,004 B2

RELAY FAILURE DIAGNOSIS CIRCUIT

CROSS REFERENCE TO RELATED APPLICATIONS

The present application claims the benefit of priority from Japanese Patent Application No. 2019-023377 filed on Feb. 13, 2019. The entire disclosures of all of the above applications are incorporated herein by reference.

TECHNICAL FIELD

The present disclosure relates to a circuit that diagnoses a failure of a relay.

BACKGROUND

There is a circuit that diagnoses a failure of a relay in a relay circuit that supplies an output from a power supply to a load side circuit.

SUMMARY

The present disclosure describes a failure diagnosis circuit may comprise a first terminal, a second terminal, a first relay and a second relay, a diagnostic signal transmission circuit, a transmission circuit diagnosis circuit, a first diagnostic signal reception circuit, a first reception circuit diagnosis circuit, a second diagnostic signal reception circuit, a second reception circuit diagnosis circuit, and a controller.

BRIEF DESCRIPTION OF DRAWINGS

Objects, features and advantages of the present disclosure will become more apparent from the following detailed description made with reference to the accompanying drawings. In the drawings.

DETAILED DESCRIPTION

Figure 1:
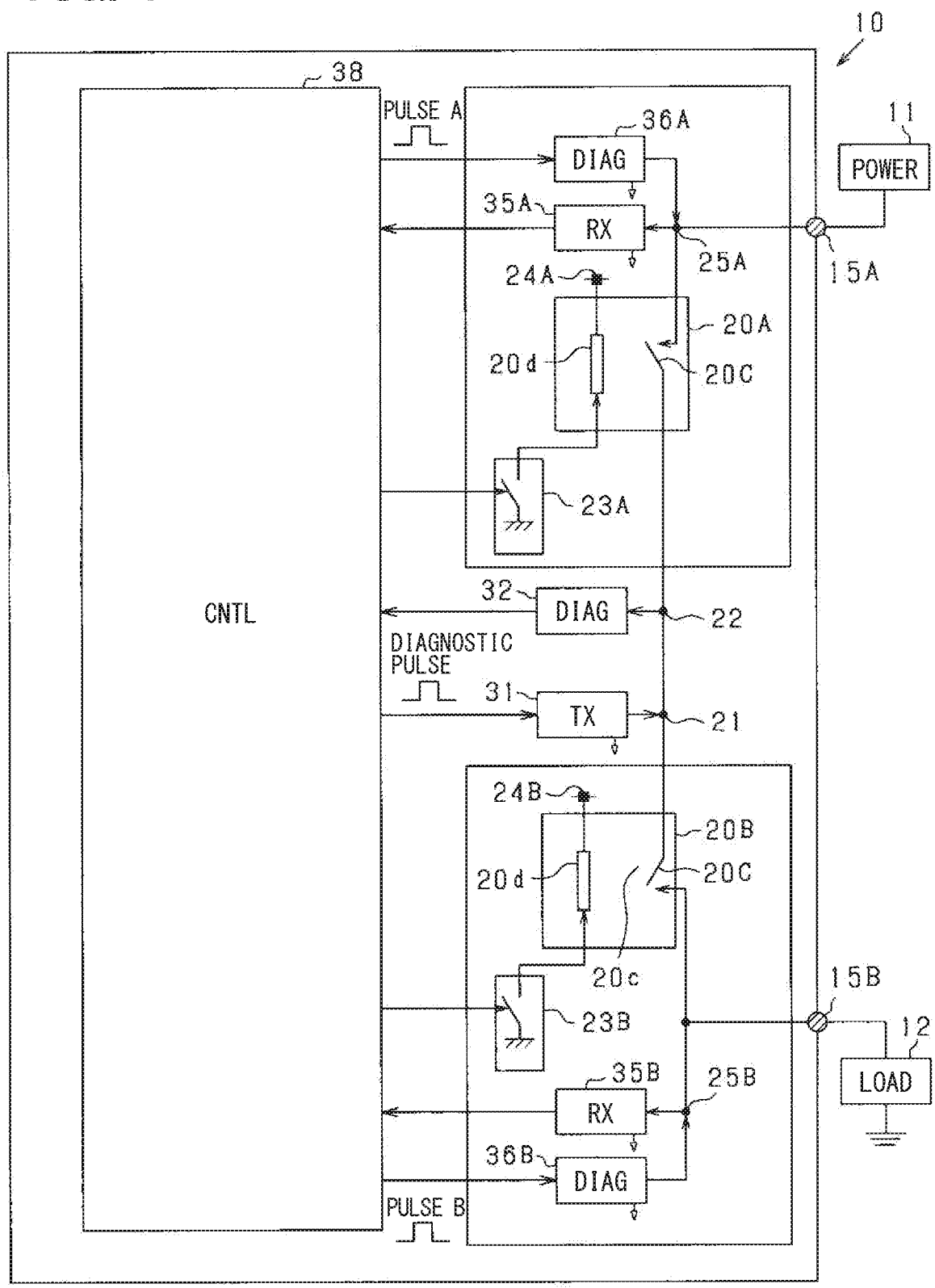
FIG. 1 is a schematic view of a relay module for PLC.

There is a circuit that diagnoses a failure of a relay in a relay circuit that supplies an output from a power supply to a load side circuit. In the circuit, a diagnostic signal generator is connected to one contact of the relay, a detector which detects a diagnostic signal is connected to the other contact of the relay, and a determiner determines an output from the detector.

In the circuit of the related technology, failures of a diagnostic signal generator (also referred to as a diagnostic signal transmission circuit) and a detector (also referred to as a diagnostic signal reception circuit) may not be diagnosed in some cases. When the diagnostic signal generator or the detector is in failure, a failure of the relay may not be correctly diagnosed in some cases.

The present disclosure describes a failure diagnosis circuit, and more specifically, a relay failure diagnosis circuit capable of diagnosing failures of a diagnostic signal transmission circuit and a diagnostic signal reception circuit, and further more specifically, a PLC (programmable logic controller) relay failure diagnosis circuit capable of diagnosing failures of a diagnostic signal transmission circuit and a diagnostic signal reception circuit.

According to one aspect of the present disclosure, a relay failure diagnosis circuit may comprises: a first terminal connected to a power supply; a second terminal connected to a load; a first relay and a second relay connected in series between the first terminal and the second terminal; a diagnostic signal transmission circuit that is connected to an output point between the first relay and the second relay, and transmits a diagnostic signal to the output point; a transmission circuit diagnosis circuit that is connected to an input point between the first relay and the second relay, and receives a signal from the input point; a first diagnostic signal reception circuit that is connected to a first detection point between the first terminal and the first relay, and receives a signal from the first detection point; a first reception circuit diagnosis circuit that is connected to the first detection point, and transmits a first signal to the first detection point; a second diagnostic signal reception circuit that is connected to a second detection point between the second terminal and the second relay, and receives a signal from the second detection point; a second reception circuit diagnosis circuit that is connected to the second detection point, and transmits a second signal to the second detection point; and a controller that is configured to control the first relay, the second relay, the diagnostic signal transmission circuit, the first reception circuit diagnosis circuit, and the second reception circuit diagnosis circuit, and diagnose whether there is failure of at least one of the diagnostic signal transmission circuit, the first diagnostic signal reception circuit, the second diagnostic signal reception circuit, the first relay, or the second relay, on a basis of reception results of at least one of the transmission circuit diagnosis circuit, the first diagnostic signal reception circuit, or the second diagnostic signal reception circuit.

According to another aspect of the present disclosure, a PLC relay failure diagnosis circuit may comprise: a first terminal connected to a power supply; a second terminal connected to a load; a first relay and a second relay connected in series between the first terminal and the second terminal; a diagnostic signal transmission circuit that is connected to an output point between the first relay and the second relay, and transmits a diagnostic signal to the output point; a transmission circuit diagnosis circuit that is connected to an input point between the first relay and the second relay, and receives a signal from the input point; a first diagnostic signal reception circuit that is connected to a first detection point between the first terminal and the first relay, and receives a signal from the first detection point; a first reception circuit diagnosis circuit that is connected to the first detection point, and transmits a first signal to the first detection point; a second diagnostic signal reception circuit that is connected to a second detection point between the second terminal and the second relay, and receives a signal from the second detection point; a second reception circuit diagnosis circuit that is connected to the second detection point, and transmits a second signal to the second detection point; and one or more controllers that are configured to control the first relay, the second relay, the diagnostic signal transmission circuit, the first reception circuit diagnosis circuit, and the second reception circuit diagnosis circuit, and diagnose failure of at least one of the diagnostic signal transmission circuit, the first diagnostic signal reception circuit, the second diagnostic signal reception circuit, the first relay, or the second relay, on a basis of reception results of at least one of the transmission circuit diagnosis circuit, the first diagnostic signal reception circuit, or the second diagnostic signal reception circuit.

Incidentally, the term "terminal A" corresponds to the term "first terminal, and the term "terminal B" corresponds to the term "second terminal. Similarly, the term "A" attached at the ending of any element may represent "a first", and the term "B" attached at the ending of any element may represent "a second". However, the terms "first" and "second" themselves does not mean any order, and they can be used in order to distinguish with each other.

In this configuration, the terminal A is connected to the power supply, and the terminal B is connected to the load. The relay A and the relay B are connected in series between the terminal A and the terminal B. Thus, electric power can be supplied from the terminal A to the terminal B by closing the relay A and the relay B.

The diagnostic signal transmission circuit is connected to the output point between the relay A and the relay B, and transmits the diagnostic signal to the output point. The transmission circuit diagnosis circuit is connected to the input point between the relay A and the relay B, and receives a signal from the input point. Thus, the controller can diagnose whether the diagnostic signal transmission circuit and the transmission circuit diagnosis circuit are normal by opening the relay A and the relay B, causing the diagnostic signal transmission circuit to transmit the diagnostic signal, and causing the transmission circuit diagnosis circuit to receive the diagnostic signal.

The diagnostic signal reception circuit A is connected to the detection point A between the terminal A and the relay A, and receives a signal from the detection point A. The reception circuit diagnosis circuit A is connected to the detection point A, and transmits the signal A to the detection point A. Thus, the controller can diagnose whether the reception circuit diagnosis circuit A and the diagnostic signal reception circuit A are normal by opening the relay A, causing the reception circuit diagnosis circuit A to transmit the signal A, and causing the diagnostic signal reception circuit A to receive the signal A. Similarly, the controller can diagnose whether the reception circuit diagnosis circuit B and the diagnostic signal reception circuit B are normal.

The controller can diagnose failures of the relay A and the relay B on condition that the diagnostic signal transmission circuit, the diagnostic signal reception circuit A, and the diagnostic signal reception circuit B are determined to be normal. For example, the controller can diagnose whether each of the relay A and the relay B is stuck closed by opening the relay A and the relay B, causing the diagnostic signal transmission circuit to transmit the diagnostic signal, and causing the diagnostic signal reception circuit A and the diagnostic signal reception circuit B to receive the diagnostic signal.

In order to correctly diagnose failures of the relay A and the relay B, it is necessary that the diagnostic signal transmission circuit be normal.

The controller may diagnose the diagnostic signal transmission circuit as being normal when the relay A and the relay B are open, and the diagnostic signal transmitted by the diagnostic signal transmission circuit is received by the transmission circuit diagnosis circuit. In such a configuration, since the relay A is open, it is possible to prevent a signal from being input from the terminal A or the reception circuit diagnosis circuit A to the transmission circuit diagnosis circuit through the relay A. When the diagnostic signal transmitted by the diagnostic signal transmission circuit is received by the transmission circuit diagnosis circuit, it can be estimated that the diagnostic signal transmission circuit and the transmission circuit diagnosis circuit are normally operating. Thus, the diagnostic signal transmission circuit can be diagnosed as being normal.

The controller may diagnose the diagnostic signal transmission circuit or the transmission circuit diagnosis circuit as having a failure when the relay A and the relay B are open, and the diagnostic signal transmitted by the diagnostic signal transmission circuit is not received by the transmission circuit diagnosis circuit. Such a configuration also makes it possible to diagnose the diagnostic signal transmission circuit or the transmission circuit diagnosis circuit as having a failure.

In order to correctly diagnose a failure of the relay A, it may be necessary that the diagnostic signal reception circuit A be normal.

The controller may diagnose the diagnostic signal reception circuit A as being normal when the relay A and the relay B are open, and the signal A transmitted by the reception circuit diagnosis circuit A is received by the diagnostic signal reception circuit A. In such a configuration, since the relay A and the relay B are open, it is possible to prevent a signal from being input from the diagnostic signal transmission circuit or the reception circuit diagnosis circuit B to the diagnostic signal reception circuit A through the relay A and the relay B. When the signal A transmitted by the reception circuit diagnosis circuit A is received by the diagnostic signal reception circuit A, it can be estimated that the reception circuit diagnosis circuit A and the diagnostic signal reception circuit A are normally operating. Thus, the diagnostic signal reception circuit A can be diagnosed as being normal.

The controller may diagnose the reception circuit diagnosis circuit A or the diagnostic signal reception circuit A as having a failure when the relay A and the relay B are open, and the signal A transmitted by the reception circuit diagnosis circuit A is not received by the diagnostic signal reception circuit A. Such a configuration also makes it possible to diagnose the reception circuit diagnosis circuit A or the diagnostic signal reception circuit A as having a failure.

The controller may diagnose the diagnostic signal reception circuit B as being normal when the relay A and the relay B are open, and the signal B transmitted by the reception circuit diagnosis circuit B is received by the diagnostic signal reception circuit B. Such a configuration makes it possible to diagnose the diagnostic signal reception circuit B as being normal.

The controller may diagnose the reception circuit diagnosis circuit B or the diagnostic signal reception circuit B as having a failure when the relay A and the relay B are open, and the signal B transmitted by the reception circuit diagnosis circuit B is not received by the diagnostic signal reception circuit B, Such a configuration makes it possible to diagnose the reception circuit diagnosis circuit B or the diagnostic signal reception circuit B as having a failure.

The controller may diagnose failures of the relay A and the relay B on condition that the diagnostic signal transmission circuit, the diagnostic signal reception circuit A, and the diagnostic signal reception circuit B are determined to be normal. Such a configuration makes it possible to diagnose failures of the relay A and the relay B in a state in which the diagnostic signal transmission circuit, the diagnostic signal reception circuit A, and the diagnostic signal reception circuit B are normal. Thus, failures of the relay A and the relay B can be correctly diagnosed.

The controller may diagnose the relay A as being stuck closed when the relay A and the relay B are open, and the diagnostic signal transmitted by the diagnostic signal transmission circuit is received by the diagnostic signal reception circuit A. Further, the controller may diagnose the relay B as being stuck closed when the relay A and the relay B are open, and the diagnostic signal transmitted by the diagnostic signal transmission circuit is received by the diagnostic signal reception circuit B. When the controller diagnoses either the relay A or the relay B is stuck closed, the controller forcibly opens the other relay.

According to the above configuration, the controller diagnoses the relay A as being stuck closed when the relay A and the relay B are open, and the diagnostic signal transmitted by the diagnostic signal transmission circuit is received by the diagnostic signal reception circuit A. Similarly, the controller diagnoses the stuck-closed condition of the relay B. When the controller diagnoses either the relay A or the relay B as being stuck closed, the controller forcibly opens the other relay. Thus, it is possible to interrupt the supply of electric power from the terminal A to the terminal B.

The controller may diagnose the relay A as being stuck open when the relay A is closed and the relay B is open, and the diagnostic signal transmitted by the diagnostic signal transmission circuit is not received by the diagnostic signal reception circuit A. Further, the controller may diagnose the relay B as being stuck open when the relay A is open and the relay B is closed, and the diagnostic signal transmitted by the diagnostic signal transmission circuit is not received by the diagnostic signal reception circuit B.

According to the above configuration, the controller can diagnose the relay A as being stuck open when the relay A is closed and the relay B is open, and the diagnostic signal transmitted by the diagnostic signal transmission circuit is not received by the diagnostic signal reception circuit A. Similarly, the controller can diagnose the stuck-open condition of the relay B.

As an example of the present disclosure, an embodiment of a relay module used in a PLC will be described with reference to the drawings.

Figure 6A:
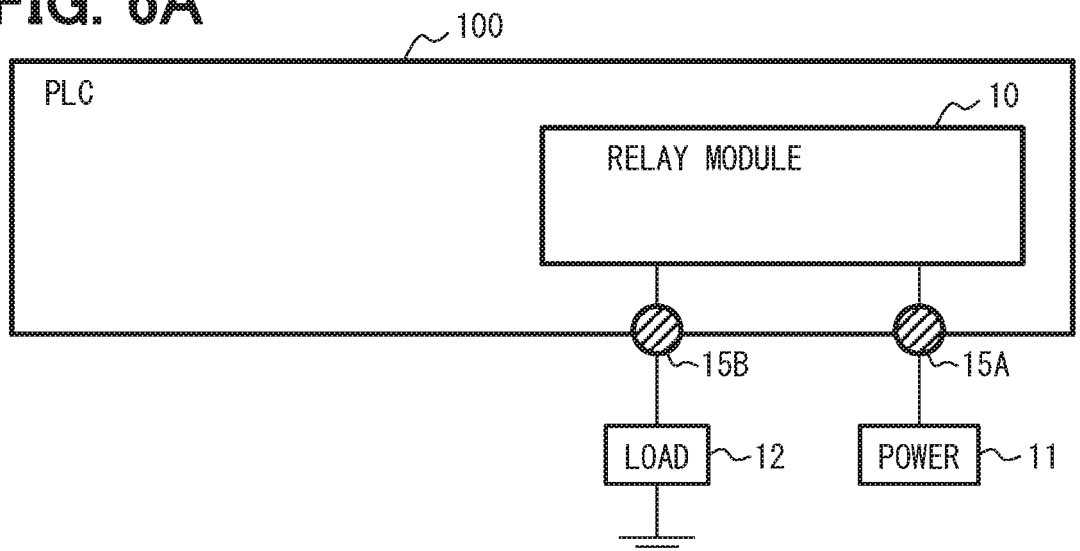
FIG. 6A is a diagram showing a configuration of PLC and the relay module.
Figure 6B:
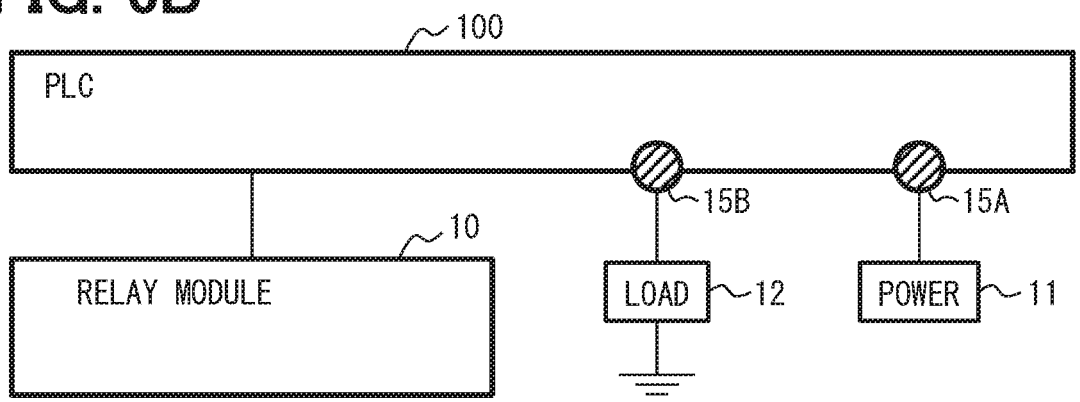
FIG. 6B is a diagram showing another example of a configuration of PLC and the relay module.
Figure 6C:
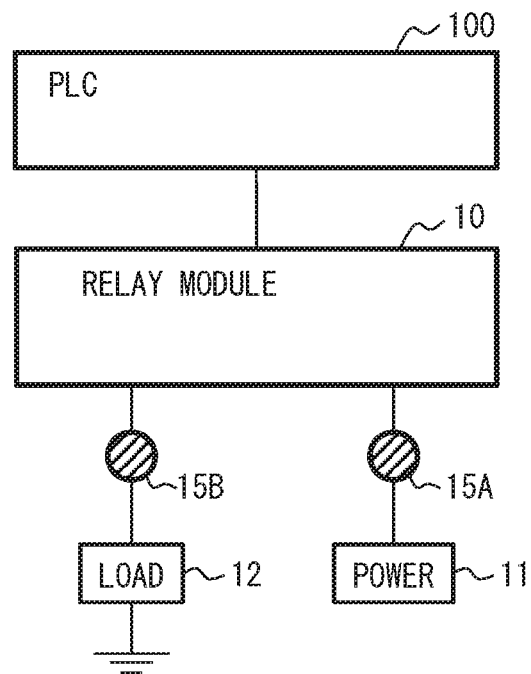
FIG. 6C is a diagram showing another example of a configuration of PLC and the relay module.

As illustrated in FIG. 1, a relay module 10 (also referred to as a PLC relay failure diagnosis circuit, or a relay failure diagnosis circuit) includes relays 20A, 20B, terminals 15A, 15B, a transmission circuit 31, reception circuits 35A, 35B, diagnosis circuits 32, 36A, 36B, a control circuit 38, and the like. The relay module 10 is formed as an integrated module incorporated in a PLC 100, as shown in FIG. 6A, for example. The relay module 10 may be connected to a PLC 100, as shown in FIG. 6B and FIG. 6C, for example. A PLC relay may correspond to a relay for PLC..

The relay 20A (also referred to as a relay A, a first relay) and the relay 20B (also referred to as a relay B, a second rely) are connected in series between the terminal 15A and the terminal 15B. Each of the relays 20A, 20B includes a contact 20c and a coil 20d. The contact 20c is open in a state in which the coil 20d is not energized, and is closed in a state in which the coil 20d is energized. In other words, the relays 20A, 20B are normally open relays.

A power supply 24A is connected to one end of the coil 20d of the relay 20A, and a power supply 24B is connected to one end of the coil 20d of the relay 20B. A switch 23A is connected to the other end of the coil 20d of the relay 20A, and a switch 23B is connected to the other end of the coil 20d of the relay 20B. An end of each of the switches 23A, 23B on the opposite side of the coil 20d is connected to the ground. When the switch 23A is closed, the coil 20d of the relay 20A is energized, and the contact 20c of the relay 20A is closed. When the switch 23B is closed, the coil 20d of the relay 20B is energized, and the contact 20c of the relay 20B is closed. Opening and closing of the switches 23A, 23B are controlled by the control circuit 38.

The terminal 15A (also referred to as a terminal A, a first terminal) is connected to a power supply 11. The terminal 15B (also referred to as a terminal B, a second terminal) is connected to a load 12. An end of the load 12 on the opposite side of the terminal 15B is connected to the ground. The load 12 (also referred to as an electric load) is various electric devices or electric circuits, or a combination thereof.

The power supply 11 supplies electric power to the terminal 15A. The power supply 11 may either be an AC power supply or a DC power supply. When various diagnoses are executed, the power supply 11 stops the supply of electric power. When the relay 20A and the relay 20B are closed, electric power is supplied from the terminal 15A to the terminal 15B. Accordingly, electric power is supplied from the terminal 15B to the load 12.

The transmission circuit 31 (corresponding to a diagnostic signal transmission circuit) is connected to an output point 21 between the relay 20A and the relay 20B. The transmission circuit 31 transmits a diagnostic pulse to the output point 21. The diagnostic pulse (also referred to as a diagnostic signal) is a high-level pulse signal which continues for a predetermined period, The transmission circuit 31 is controlled by the control circuit 38.

The diagnosis circuit 32 (corresponding to a transmission circuit diagnosis circuit) is connected to an input point 22 between the relay 20A and the relay 20B. The diagnosis circuit 32 receives a signal from the input point 22, and transmits a high-level or low-level reception result to the control circuit 38. When a signal received from the input point 22 is a high-level signal, the diagnosis circuit 32 transmits a high-level reception result to the control circuit 38. When a signal received from the input point 22 is a low-level signal, the diagnosis circuit 32 transmits a low-level reception result to the control circuit 38. The position of the transmission circuit 31 and the output point 21 and the position of the diagnosis circuit 32 and the input point 22 are interchangeable.

The reception circuit 35A is connected to a detection point 25A (also referred to as a detection point A, a first detection point) between the terminal 15A and the relay 20A. The reception circuit 35A (also referred to as a diagnostic signal reception circuit A, a first diagnostic signal reception circuit) receives a signal from the detection point 25A and transmits a high-level or low-level reception result to the control circuit 38.

The diagnosis circuit 36A is connected to the detection point 25A. The diagnosis circuit 36A (also referred to as a reception circuit diagnosis circuit A, a first reception circuit diagnosis circuit) transmits a pulse A to the detection point 25A. The pulse A (corresponding to a signal A, a first signal) is a high-level pulse signal which continues for a predetermined period. The diagnosis circuit 36A is controlled by the control circuit 38.

The reception circuit 35B is connected to a detection point 25B (also referred to as a detection point B, a second detection point) between the terminal 15B and the relay 20B. The reception circuit 35B (also referred to as a diagnostic signal reception circuit B, a second diagnostic signal reception circuit) receives a signal from the detection point 25B and transmits a high-level or low-level reception result to the control circuit 38.

The diagnosis circuit 36B is connected to the detection point 25B. The diagnosis circuit 36B (also referred to as a reception circuit diagnosis circuit B, a second reception circuit diagnosis circuit) transmits a pulse B to the detection point 25B. The pulse B (corresponding to a signal B, a second signal) is a high-level pulse signal which continues for a predetermined period.

The diagnosis circuit 36B is controlled by the control circuit 38.

The control circuit 38 (corresponding to a controller) is a microcomputer including a CPU, a ROM, a RAM, an input/output interface, and the like. The control circuit 38 controls the switches 23A, 23B (relays 20A, 20B), the transmission circuit 31, and the diagnosis circuits 36A, 36B. The control circuit 38 closes both the relays 20A, 20B when electric power is supplied from the power supply 11 to the load 12. The control circuit 38 opens both the relays 20A, 20B when electric power is not supplied from the power supply 11 to the load 12. The control circuit 38 inputs reception results of the diagnosis circuit 32 and the reception circuits 35A, 35B. The control circuit 38 diagnoses failures of the transmission circuit 31, the reception circuits 35A, 35B, and the relays 20A, 20B on the basis of the reception results of the diagnosis circuit 32 and the reception circuits 35A, 35B. Specifically, the control circuit 38 executes a transmission circuit diagnosis, a reception circuit diagnosis, a stuck-closed condition diagnosis, and a stuck-open condition diagnosis. The control circuit 38 is controlled by a host control apparatus.

Figure 2:
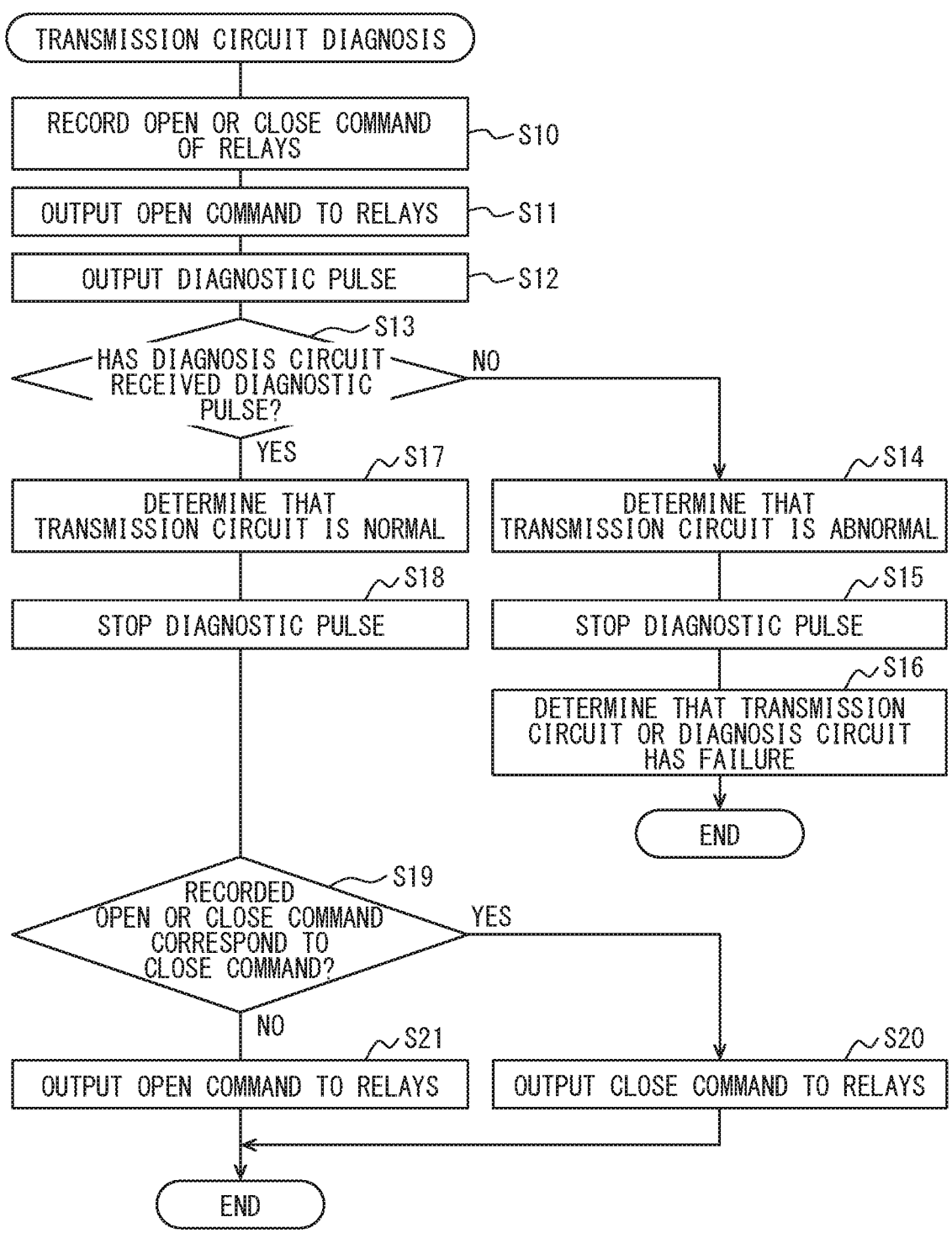
FIG. 2 is a flowchart illustrating a procedure of a transmission circuit diagnosis.

FIG. 2 is a flowchart illustrating a procedure of the transmission circuit diagnosis. The series of processing is executed as the first diagnosis by the control circuit 38.

The current open-or-close command to the relays 20A, 20B is recorded (S10). An open command is output to the relays 20A, 20B (S11). Specifically, a signal for opening the switches 23A, 23B is output. A diagnostic pulse is transmitted by the transmission circuit 31 (S12). The open-or-close command may be referred to as an open/close command.

Then, it is determined whether the diagnosis circuit 32 has received the diagnostic pulse (S13). Specifically, it is determined whether the diagnosis circuit 32 has received a high-level signal within a predetermined diagnostic period after the transmission of the diagnostic pulse by the transmission circuit 31. When it is determined that the diagnosis circuit 32 has not received the diagnostic pulse in the determination (S13: NO), the transmission circuit 31 is determined to be abnormal (S14). The diagnostic pulse is stopped by the transmission circuit 31 (S15). The transmission circuit 31 or the diagnosis circuit 32 is diagnosed as having a failure (S16). Then, the series of processing is terminated. A period from the execution of the processing of S12 to the execution of the processing of S18 corresponds to the predetermined diagnostic period.

When it is determined that the diagnosis circuit 32 has received the diagnostic pulse in the determination of S13 (S13: YES), the transmission circuit 31 is determined to be normal (S17). The diagnostic pulse is stopped by the transmission circuit 31 (S18).

It is determined whether the open-or-close command recorded in the processing of S10 is a close command (S19). When it is determined that the recorded open-or-close command is a close command in the determination (S19: YES), a close command is output to the relays 20A, 20B (S20). Specifically, a signal for closing the switches 23A, 23B is output. Then, the series of processing is terminated.

When it is determined that the recorded open-or-close command is not a close command in the determination of S19 (S19: NO), an open command is output to the relays 20A, 20B (S21). Specifically, a signal for opening the switches 23A, 23B is output. Then, the series of processing is terminated.

Figure 3:
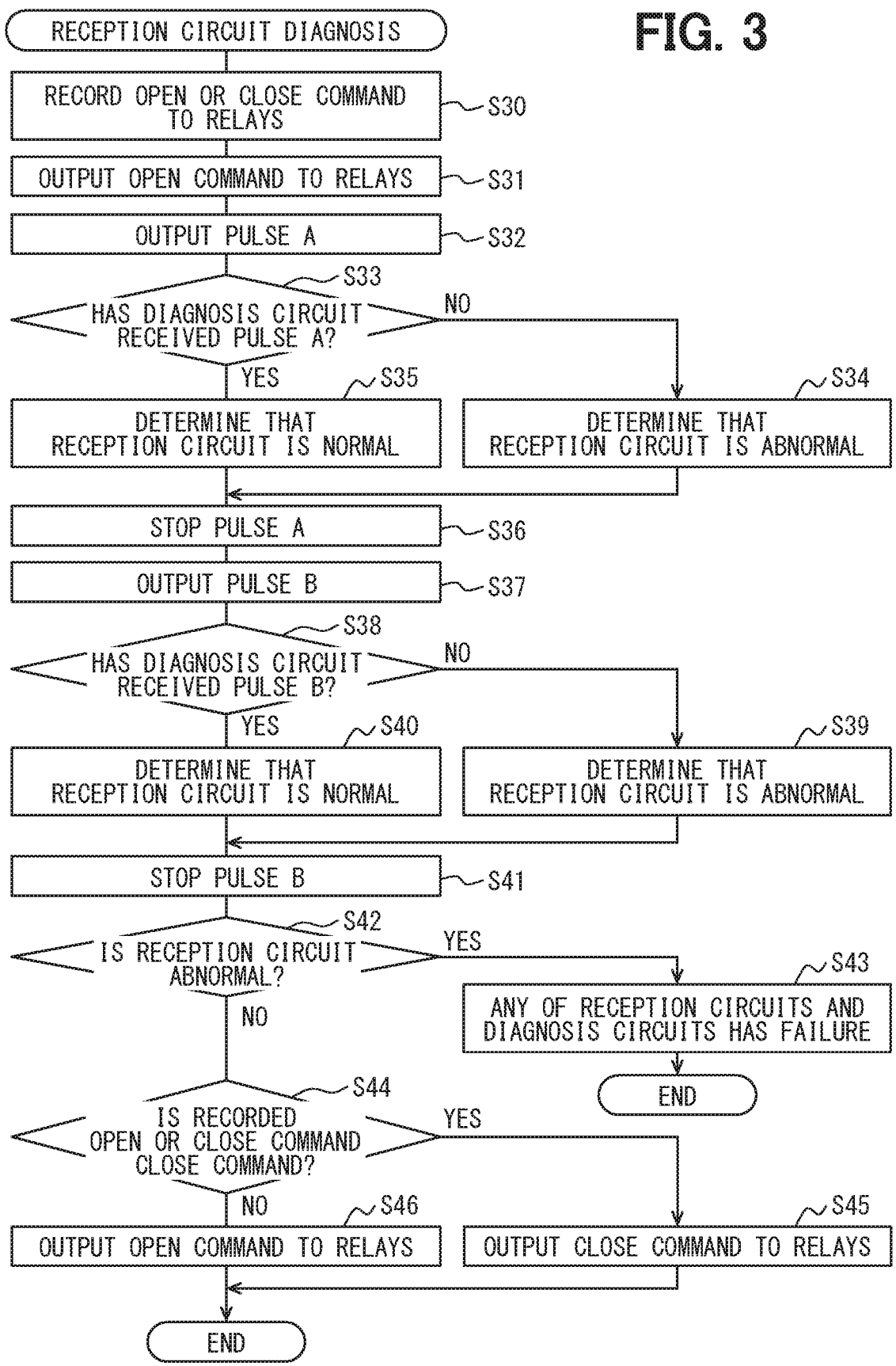
FIG. 3 is a flowchart illustrating a procedure of a reception circuit diagnosis.

FIG. 3 is a flowchart illustrating a procedure of the reception circuit diagnosis. The series of processing is executed by the control circuit 38 on condition that the transmission circuit 31 is determined to be normal by the transmission circuit diagnosis described above. That is, when the transmission circuit 31 is determined to be abnormal by the transmission circuit diagnosis, the reception circuits 35A, 35B cannot be correctly diagnosed. Thus, the reception circuit diagnosis is not executed.

The processing of S30, S31 are equal to the processing of S10, S11, respectively.

A pulse A is transmitted by the diagnosis circuit 36A (S32). It is determined whether the reception circuit 35A has received the pulse A (S33). Specifically, it is determined whether the reception circuit 35A has received a high-level signal within a predetermined diagnostic period after the transmission of the pulse A by the diagnosis circuit 36A. When it is determined that the reception circuit 35A has not received the pulse A in the determination (S33: NO), the reception circuit 35A is determined to be abnormal (S34). When it is determined that the reception circuit 35A has received the pulse A in the determination (S33: YES), the reception circuit 35A is determined to be normal (S35). The pulse A is stopped by the diagnosis circuit 36A (S36). A period from the execution of the processing of S32 to the execution of the processing of S36 corresponds to the predetermined diagnostic period.

A pulse B is transmitted by the diagnosis circuit 36B (S37). It is determined whether the reception circuit 35B has received the pulse B (S38). Specifically, it is determined whether the reception circuit 35B has received a high-level signal within a predetermined diagnostic period after the transmission of the pulse B by the diagnosis circuit 36B. When it is determined that the reception circuit 35B has not received the pulse B in the determination (S38: NO), the reception circuit 35B is determined to be abnormal (S39). When it is determined that the reception circuit 35B has received the pulse B in the determination (S38: YES), the reception circuit 35B is determined to be normal (S40). The pulse B is stopped by the diagnosis circuit 36B (S41). A period from the execution of the processing of S37 to the execution of the processing of S41 corresponds to the predetermined diagnostic period.

Then, it is determined whether the reception circuit 35A or the reception circuit 35B is abnormal (542). When it is determined that the reception circuit 35A or the reception circuit 35B is abnormal in the determination (S42: YES), any of the reception circuits 35A, 35B and the diagnosis circuits 36A, 36B is diagnosed as having a failure (S43). Then, the series of processing is terminated.

When it is determined that neither the reception circuit 35A nor the reception circuit 35B is abnormal (both of them are normal) in the determination of S42 (S42: NO), the processing shifts to S44.

The processing of S44 to S46 are equal to the processing of S19 to S21, respectively. Then, the series of processing is terminated.

Figure 4:
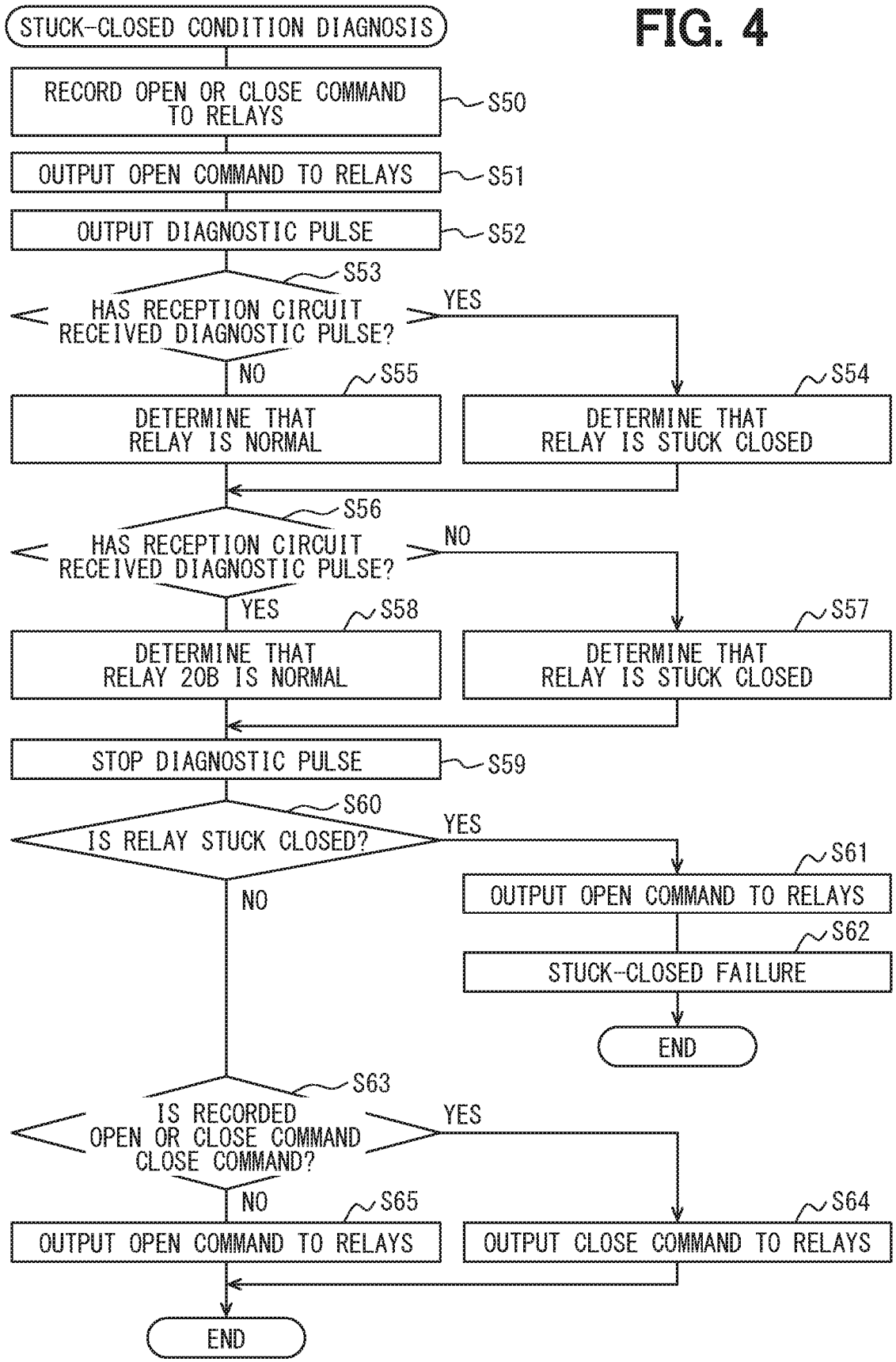
FIG. 4 is a flowchart illustrating a procedure of a stuck-closed condition diagnosis.

FIG. 4 is a flowchart illustrating a procedure of the stuck-closed condition diagnosis. The series of processing is executed by the control circuit 38 on conditions that the transmission circuit 31 is determined to be normal by the transmission circuit diagnosis described above and the reception circuits 35A, 35B are determined to be normal by the reception circuit diagnosis described above. That is, when the transmission circuit 31 is determined to be abnormal or when either the reception circuit 35A or 35B is determined to be abnormal, the stuck-closed condition of the relays 20A, 20B cannot be correctly diagnosed. Thus, the stuck-closed condition diagnosis (the failure diagnosis for the relays 20A, 20B) is not executed.

The processing of S50 to S52 is equal to the processing of S10 to S12, respectively.

It is determined whether the reception circuit 35A has received the diagnostic pulse (S53). When it is determined that the reception circuit 35A has received the diagnostic pulse in the determination (S53: YES), the relay 20A is determined to be stuck closed (S54). When it is determined that the reception circuit 35A has not received the diagnostic pulse in the determination (S53: NO), the relay 20A is determined to be normal (S55).

Then, it is determined whether the reception circuit 35B has received the diagnostic pulse (S56). When it is determined that the reception circuit 35B has received the diagnostic pulse in the determination (S56: YES), the relay 20B is determined to be stuck closed (S57). When it is determined that the reception circuit 35B has not received the diagnostic pulse in the determination (S56: NO), the relay 20B is determined to be normal (S58). The diagnostic pulse is stopped by the transmission circuit 31 (S59).

Then, it is determined whether the relay 20A or the relay 20B is stuck closed (S60). When it is determined that the relay 20A or the relay 20B is stuck closed in the determination (S60: YES), an open command is output to the relays 20A, 20B (S61). Specifically, when either the relay 20A or the relay 20B is diagnosed as being stuck closed, the other relay is forcibly opened. The relays 20A, 20B are diagnosed as having a stuck-closed failure (S62). Then, the series of processing is terminated.

When it is determined that neither the relay 20A nor the relay 20B is stuck closed in the determination of S60 (S60: NO), the processing shifts to S63.

The processing of S63 to S65 is equal to the processing of S19 to S21, respectively. Then, the series of processing is terminated.

Figure 5:
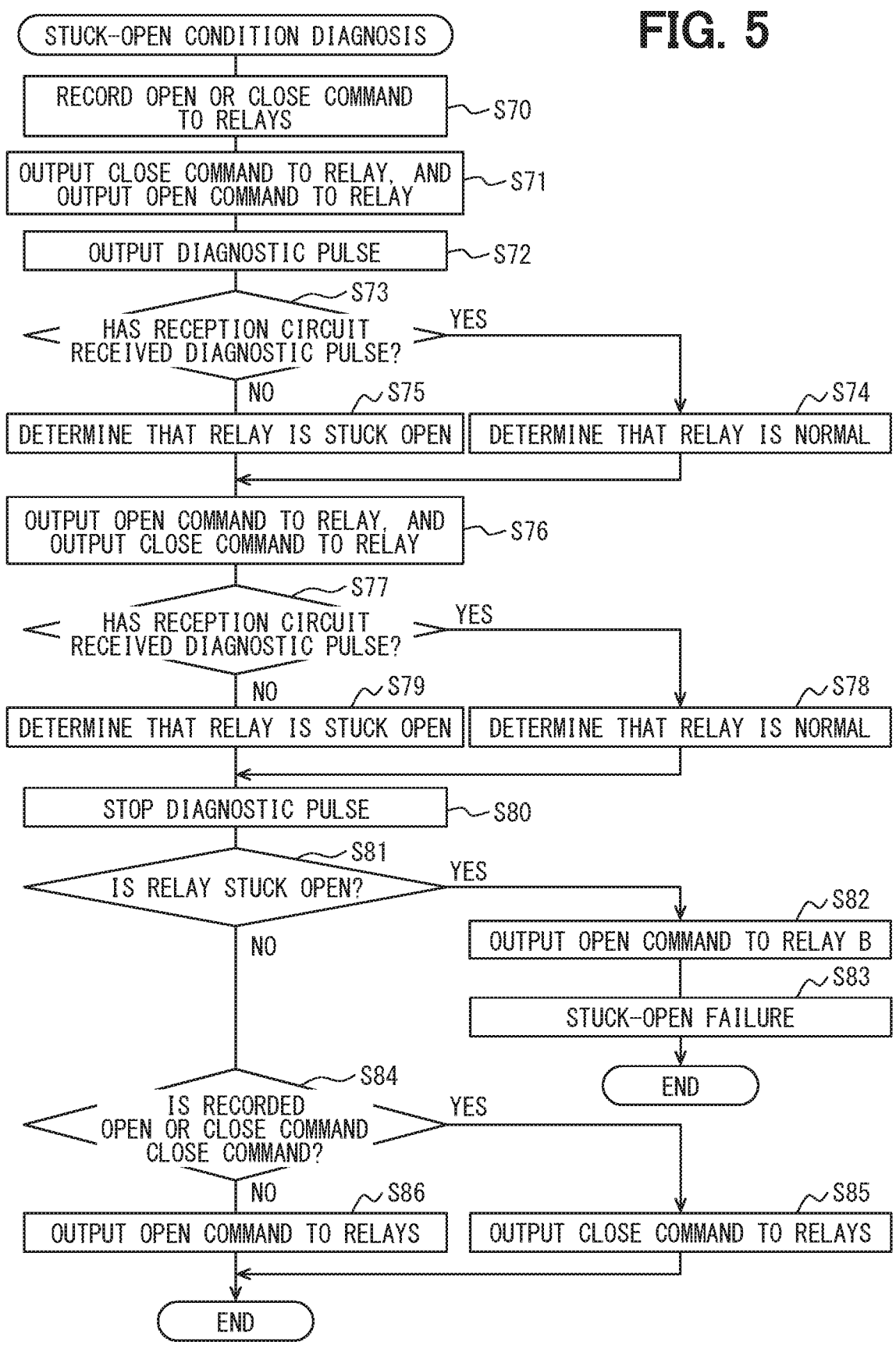
FIG. 5 is a flowchart illustrating a procedure of a stuck-open condition diagnosis.

FIG. 5 is a flowchart illustrating a procedure of the stuck-open condition diagnosis. The series of processing is executed by the control circuit 38 on conditions that the transmission circuit 31 is determined to be normal by the transmission circuit diagnosis described above and the reception circuits 35A, 35B are determined to be normal by the reception circuit diagnosis described above. That is, when the transmission circuit 31 is determined to be abnormal or when either the reception circuit 35A or the reception circuit 35B is determined to be abnormal, the stuck-open condition of the relays 20A, 203 cannot be correctly diagnosed. Thus, the stuck-open condition diagnosis (the failure diagnosis for the relays 20A, 20B) is not executed.

The processing of S70 is equal to the processing of S10. A close command is output to the relay 20A, and the open command is output to the relay 20B (S71). A diagnostic pulse is transmitted by the transmission circuit 31 (S72).

It is determined whether the reception circuit 35A has received the diagnostic pulse (S73). When it is determined that the reception circuit 35A has received the diagnostic pulse in the determination (S73: YES), the relay 20A is determined to be normal (S74). When it is determined that the reception circuit 35A has not received the diagnostic pulse in the determination (S73: NO), the relay 20A is determined to be stuck open (S75).

Then, an open command is output to the relay 20A, and a close command is output to the relay 20B (S76).

It is determined whether the reception circuit 35B has received the diagnostic pulse (S77). When it is determined that the reception circuit 35B has received the diagnostic pulse in the determination (S77: YES), the relay 20B is determined to be normal (S78). When it is determined that the reception circuit 35B has not received the diagnostic pulse in the determination (S77: NO), the relay 20B is determined to be stuck open (S79). The diagnostic pulse is stopped by the transmission circuit 31 (S80).

Then, it is determined whether the relay 20A or the relay 20B is stuck open (S81). When it is determined that the relay 20A or the relay 20B is stuck open in the determination (S81: YES), an open command is output to the relay 20B (S82). The relays 20A, 20B are diagnosed as having a stuck-open failure (S83). Then, the series of processing is terminated.

When it is determined that neither the relay 20A nor the relay 20B is stuck open in the determination of S81 (S81: NO), the processing shifts to S84.

The processing of S84 to S86 is equal to the processing of S19 to S21, respectively. Then, the series of processing is terminated.

The present embodiment described in detail above has the following advantages as an example.

The reception circuit 35A is connected to the detection point 25A between the terminal 15A and the relay 20A, and receives a signal from the detection point 25A. The diagnosis circuit 36A is connected to the detection point 25A, and transmits the pulse A to the detection point 25A. Thus, the control circuit 38 can diagnose whether the diagnosis circuit 36A and the reception circuit 35A are normal by opening the relay 20A, causing the diagnosis circuit 36A to transmit the pulse A, and causing the reception circuit 35A to receive the pulse A. Similarly, the control circuit 38 can diagnose whether the diagnosis circuit 36B and the reception circuit 35B are normal.

The control circuit 38 diagnoses the transmission circuit 31 as being normal when the relay 20A and the relay 20B are open, and the diagnostic pulse transmitted by the transmission circuit 31 is received by the diagnosis circuit 32. In such a configuration, since the relay 20A is open, it is possible to prevent a signal from being input from the terminal 15A or the diagnosis circuit 36A to the diagnosis circuit 32 through the relay 20A. When the diagnostic pulse transmitted by the transmission circuit 31 is received by the diagnosis circuit 32, it can be estimated that the transmission circuit 31 and the diagnosis circuit 32 are normally operating. Thus, the transmission circuit 31 can be diagnosed as being normal.

The control circuit 38 diagnoses the transmission circuit 31 or the diagnosis circuit 32 as having a failure when the relay 20A and the relay 20B are open, and the diagnostic pulse transmitted by the transmission circuit 31 is not received by the diagnosis circuit 32. Such a configuration also makes it possible to diagnose the transmission circuit 31 or the diagnosis circuit 32 as having a failure.

The control circuit 38 diagnoses the reception circuit 35A as being normal when the relay 20A and the relay 20B are open, and the pulse A transmitted by the diagnosis circuit 36A is received by the reception circuit 35A. In such a configuration, since the relay 20A and the relay 20B are open, it is possible to prevent a signal from being input from the transmission circuit 31 or the diagnosis circuit 36B to the reception circuit 35A through the relay 20A and the relay 20B. When the pulse A transmitted by the diagnosis circuit 36A is received by the reception circuit 35A, it can be estimated that the diagnosis circuit 36A and the reception circuit 35A are normally operating. Thus, the reception circuit 35A can be diagnosed as being normal.

The control circuit 38 diagnoses the diagnosis circuit 36A or the reception circuit 35A as having a failure when the relay 20A and the relay 20B are open, and the pulse A transmitted by the diagnosis circuit 36A is not received by the reception circuit 35A. Such a configuration also makes it possible to diagnose the diagnosis circuit 36A or the reception circuit 35A as having a failure.

The control circuit 38 diagnoses the reception circuit 35B as being normal when the relay 20A and the relay 20B are open, and the pulse B transmitted by the diagnosis circuit 36B is received by the reception circuit 35B. Such a configuration makes it possible to diagnose the reception circuit 35B as being normal.

The control circuit 38 diagnoses the diagnosis circuit 36B or the reception circuit 35B as having a failure when the relay 20A and the relay 20B are open, and the pulse B transmitted by the diagnosis circuit 36B is not received by the reception circuit 35B. Such a configuration makes it possible to diagnose the diagnosis circuit 36B or the reception circuit 35B as having a failure.

The control circuit 38 diagnoses failures of the relay 20A and the relay 20B on condition that the transmission circuit 31, the reception circuit 35A, and the reception circuit 35B are determined to be normal. Such a configuration makes it possible to diagnose failures of the relay 20A and the relay 20B in a state in which the transmission circuit 31, the reception circuit 35A, and the reception circuit 35B are normal. Thus, failures of the relay 20A and the relay 20B can be correctly diagnosed.

The control circuit 38 diagnoses the relay 20A as being stuck closed when the relay 20A and the relay 20B are open, and the diagnostic pulse transmitted by the transmission circuit 31 is received by the reception circuit 35A. Similarly, the control circuit 38 diagnoses the stuck-closed condition of the relay 20B. When the control circuit 38 diagnoses either the relay 20A or the relay 20B as being stuck closed, the control circuit 38 forcibly opens the other relay. Thus, it is possible to interrupt the supply of electric power from the terminal 15A to the terminal B.

The control circuit 38 can diagnose the relay 20A as being stuck open when the relay 20A is closed and the relay 20B is open, and the diagnostic pulse transmitted by the transmission circuit 31 is not received by the reception circuit 35A. Similarly, the control circuit 38 can diagnose the stuck-open condition of the relay 20B.

The above embodiment can be modified and implemented as described below. Parts identical to the parts of the above embodiment are designated by the same reference signs as the above embodiment to omit redundant description.

In the processing of S82 of FIG. 5, the control circuit 38 may output an open command to the relays 20A, 20B. That is, when either the relay 20A or the relay 20B is diagnosed as being stuck open, the control circuit 38 may forcibly open the other relay.

When the relay 20A is determined to be stuck open in S73, S75 of FIG. 5, the control circuit 38 may output an open command to the relay 20B and terminate the stuck-open condition diagnosis. That is, when either the relay 20A or the relay 20B is determined to be stuck open, the control circuit 38 may forcibly open the other relay without determining whether the other relay is stuck open.

When the relay 20A is determined to be stuck closed in S53, S54 of FIG. 4, the control circuit 38 may output an open command to the relay 20B and terminate the stuck-closed condition diagnosis. That is, when either the relay 20A or the relay 20B is determined to be stuck closed, the control circuit 38 may forcibly open the other relay without determining whether the other relay is stuck closed.

The control circuit 38 may determine that the reception circuit 35A (35B) is normal when the relay 20A (20B) is open and the relay 20B (relay 20A) is closed, and the pulse A (pulse B) transmitted by the diagnosis circuit 36A (36B) is received by the reception circuit 35A (35B).

The control circuit 38 may execute the stuck-closed condition diagnosis of FIG. 4 and the stuck-open condition diagnosis of FIG. 5 prior to the transmission circuit diagnosis of FIG. 2 and the reception circuit diagnosis of FIG. 3. When the transmission circuit 31 or the diagnosis circuit 32 is diagnosed as having a failure by the transmission circuit diagnosis, a result of the stuck-closed condition diagnosis and a result of the stuck-open condition diagnosis may be invalidated. Similarly, when the reception circuit 35A or the diagnosis circuit 36A is diagnosed as having a failure by the reception circuit diagnosis, a result of the stuck-closed condition diagnosis and a result of the stuck-open condition diagnosis for the relay 20A may be invalidated. Further, when the reception circuit 35B or the diagnosis circuit 36B is diagnosed as having a failure by the reception circuit diagnosis, a result of the stuck-closed condition diagnosis and a result of the stuck-open condition diagnosis for the relay 20B may be invalidated.

Each of the relays 20A, 20B is not limited to an electromagnetic switch, and may be a semiconductor switch. Each of the relays 20A, 20B is not limited to a normally open switch, and may be a normally closed switch.

The load 12 and the ground may be connected to the terminal 15A, and the power supply 11 may be connected to the terminal 15B.

Incidentally, in a case where the flowchart terminates through S16, S43, S62, or S83, each of the relay 20A and the relay 20B may cause the corresponding contact 200 to open with reception of the open command from the control circuit 38.

The transmission circuit 31 corresponds to a diagnostic signal transmission circuit. The diagnosis circuit 32 corresponds to a transmission circuit diagnosis circuit. The reception circuit 35A corresponds to a diagnostic signal reception circuit A, or a first diagnostic signal reception circuit. The reception circuit 35B corresponds to a diagnostic signal reception circuit B, or a second diagnostic signal reception circuit. The diagnosis circuit 36A corresponds to a reception circuit diagnosis circuit A, or a first reception circuit diagnosis circuit. The diagnosis circuit 36B corresponds to a reception circuit diagnosis circuit B, or a second reception circuit diagnosis circuit. The control circuit 38 corresponds to a controller.

The controllers and methods described in the present disclosure may be implemented by a special purpose computer created by configuring a memory and a processor programmed to execute one or more particular functions embodied in computer programs. Alternatively, the controllers and methods described in the present disclosure may be implemented by a special purpose computer created by configuring a processor provided by one or more special purpose hardware logic circuits. Alternatively, the controllers and methods described in the present disclosure may be implemented by one or more special purpose computers created by configuring a combination of a memory and a processor programmed to execute one or more particular functions and a processor provided by one or more hardware logic circuits. The computer programs may be stored, as instructions being executed by a computer, in a tangible non-transitory computer-readable medium.

It is noted that a flowchart or the processing of the flowchart in the present application includes multiple steps (also referred to as sections), each of which is represented, for instance, as S10. Further, each step can be divided into several sub-steps while several steps can be combined into a single step.

While various embodiments, configurations, and aspects of a relay failure diagnosis circuit according to the present disclosure have been exemplified, the embodiments, configurations, and aspects of the present disclosure are not limited to those described above. For example, embodiments, configurations, and aspects obtained from an appropriate combination of technical elements disclosed in different embodiments, configurations, and aspects are also included within the scope of the embodiments, configurations, and aspects of the present disclosure.

What is claimed is:

1. A relay failure diagnosis circuit comprising:
   a first terminal connected to a power supply;
   a second terminal connected to a load;
   a first relay and a second relay connected in series between the first terminal and the second terminal;
   a diagnostic signal transmission circuit that is connected to an output point between the first relay and the second relay, and transmits a diagnostic signal to the output point;
   a transmission circuit diagnosis circuit that is connected to an input point between the first relay and the second relay, and receives a signal from the input point;
   a first diagnostic signal reception circuit that is connected to a first detection point between the first terminal and the first relay, and receives a signal from the first detection point;
   a first reception circuit diagnosis circuit that is connected to the first detection point, and transmits a first signal to the first detection point;
   a second diagnostic signal reception circuit that is connected to a second detection point between the second terminal and the second relay, and receives a signal from the second detection point;
   a second reception circuit diagnosis circuit that is connected to the second detection point, and transmits a second signal to the second detection point; and
   one or more controllers that are configured to
      control the first relay, the second relay, the diagnostic signal transmission circuit, the first reception circuit diagnosis circuit, and the second reception circuit diagnosis circuit, and
      diagnose whether there is failure of at least one of the diagnostic signal transmission circuit, the first diagnostic signal reception circuit, the second diagnostic signal reception circuit, the first relay, or the second relay, on a basis of reception results of at least one of the transmission circuit diagnosis circuit, the first diagnostic signal reception circuit, or the second diagnostic signal reception circuit.

2. The relay failure diagnosis circuit according to claim 1, wherein
   the controller diagnoses the diagnostic signal transmission circuit as being normal in response to that the first relay and the second relay are open, and the diagnostic signal transmitted by the diagnostic signal transmission circuit is received by the transmission circuit diagnosis circuit.

3. The relay failure diagnosis circuit according to claim 1, wherein
   the controller diagnoses the diagnostic signal transmission circuit or the transmission circuit diagnosis circuit as having a failure in response to that the transmission circuit diagnosis circuit does not receive the diagnostic signal transmitted by the diagnostic signal transmission circuit in a case where the first relay and the second relay are open and the diagnostic signal transmission circuit transmit the diagnostic signal.

4. The relay failure diagnosis circuit according to claim 1, wherein
   the controller diagnoses the first diagnostic signal reception circuit as being normal in response to that the first diagnostic signal reception circuit receives the first signal transmitted by the first reception circuit diagnosis circuit in a case where the first relay and the second relay are open and the first reception circuit diagnosis circuit transmits the first signal.

5. The relay failure diagnosis circuit according to claim 1, wherein
   the controller diagnoses the first reception circuit diagnosis circuit or the first diagnostic signal reception circuit as having a failure in response to that the first diagnostic signal reception circuit does not receive the first signal in a case where the first relay and the second relay are open and the first reception circuit diagnosis circuit transmits the first signal.

6. The relay failure diagnosis circuit according to claim 1, wherein
   the controller diagnoses the second diagnostic signal reception circuit as being normal in response to that the second diagnostic signal reception circuit receives the second signal transmitted by the second reception circuit diagnosis circuit in a case where the first relay and the second relay are open and the second reception circuit diagnosis circuit transmits the second signal.

7. The relay failure diagnosis circuit according to claim 1, wherein
   the controller diagnoses the second reception circuit diagnosis circuit or the second diagnostic signal reception circuit as having a failure in response to that the second diagnostic signal reception circuit does not receives the second signal in a case where the first relay and the second relay are open and the second reception circuit diagnosis circuit transmits the second signal.

8. The relay failure diagnosis circuit according to claim 1, wherein
   the controller diagnoses whether there is failure of at least one of the first relay or the second relay under a condition that the diagnostic signal transmission circuit, the first diagnostic signal reception circuit, and the second diagnostic signal reception circuit are determined to be normal.

9. The relay failure diagnosis circuit according to claim 1, wherein
   the controller diagnoses the first relay as being stuck closed in response to that the first relay and the second relay are open, and the diagnostic signal transmitted by the diagnostic signal transmission circuit is received by the first diagnostic signal reception circuit,
   the controller diagnoses the second relay as being stuck closed in response to that the first relay and the second relay are open, and the diagnostic signal transmitted by the diagnostic signal transmission circuit is received by the second diagnostic signal reception circuit, and in response to that the controller diagnoses one relay of the first relay or the second relay is stuck closed, the controller forcibly opens a different relay.

10. The relay failure diagnosis circuit according to claim 1, wherein the controller diagnoses the first relay as being stuck open in response to that the first relay is closed and the second relay is open, and the diagnostic signal transmitted by the diagnostic signal transmission circuit is not received by the first diagnostic signal reception circuit, and the controller diagnoses the second relay as being stuck open in response to that the first relay is open and the second relay is closed, and the diagnostic signal transmitted by the diagnostic signal transmission circuit is not received by the second diagnostic signal reception circuit.

* * * * *